(12) United States Patent
Ellison et al.

(10) Patent No.: US 7,018,597 B2
(45) Date of Patent: Mar. 28, 2006

(54) HIGH RESISTIVITY SILICON CARBIDE SINGLE CRYSTAL

(75) Inventors: Alexandre Ellison, Linköping (SE);
Nguyen Tien Son, Linköping (SE);
Björn Magnusson, Linköping (SE);
Erik Janzén, Borensberg (SE)

(73) Assignee: Norstel AB, Linköping (SE)

( * ) Notice: Subject to any disclaimer, the term of this patent is extended or adjusted under 35 U.S.C. 154(b) by 52 days.

(21) Appl. No.: 10/281,173

(22) Filed: Oct. 28, 2002

(65) Prior Publication Data
US 2003/0079676 A1  May 1, 2003

(30) Foreign Application Priority Data
Oct. 29, 2001 (SE) .................................... 0103602

(51) Int. Cl.
*C30B 29/36* (2006.01)

(52) U.S. Cl. ..................... 423/345; 117/84; 117/105; 117/103

(58) Field of Classification Search ............ 117/84, 117/103, 105; 423/345
See application file for complete search history.

(56) References Cited

U.S. PATENT DOCUMENTS

| 5,611,955 A | 3/1997 | Barrett et al. |
| 6,218,680 B1 | 4/2001 | Carter, Jr. et al. |

OTHER PUBLICATIONS

L. Torpo et al., Comprehensive ab initio Study of Properties of Monovacancies and Antisite in 4H-SiC, J. Phys: Condens. Matter 13, 2001, pp. 6203-6231.
N.T. Son et al., Silicon Antisite in 4H SiC, Physical Review Letters, vol. 87, No. 4, Jul. 23, 2001, pp. 045502-1-045502-4.
J.R. Jenny et al., Deep Level Transient Spectroscopic and Hall Effect Investigation of the Position of the Vanadium Acceptor Level in 4H and 6H SiC, Appl. Phys. Lett. 68, Apr. 1, 1996, pp. 1963-1965.
N.T. Son et al., Carbon Vacancy-Related Defect in 4H and 6H SiC, Physical Review B, vol. 63, pp. 201201-1-201201-4.
M. Bickermann et al., Incorporation of Boron and Vanadium During PCT growth of 6H-SiC Crystals, Journal of Crystal Growth 233, 2001, pp. 211-218.
T. Dalibor et al., Deep Defect Centers in Silicon Carbide Monitored with Deep Level Transient Spectroscopy, Phys. Stat. Sol. (a) 162, pp. 199-225.
V. Balakrishna et al., Impurity Effects in the Growth of 4H-SiC Crystals by Physical Vapor Transport, Mat. Res. Soc. Symp. Proc. vol. 572, 1999, pp. 245-253.

*Primary Examiner*—Robert Kunemund
(74) *Attorney, Agent, or Firm*—Venable LLP; Eric J. Franklin

(57) ABSTRACT

The purpose of the invention is to provide a high resistivity silicon carbide substrate with electrical properties and structural quality suitable for subsequent device manufacturing, such as for example high frequency devices, so that the devices can exhibit stable and linear characteristics and to provide a high resistivity silicon carbide substrate having a low density of structural defects and a substantially controlled uniform radial distribution of its resistivity.

21 Claims, 16 Drawing Sheets

PRIOR ART $$N_{DD} > N_{SA} - N_{SD} > 0$$

Photo-EPR of the positively charged carbon vacancy ($V_C^+$)

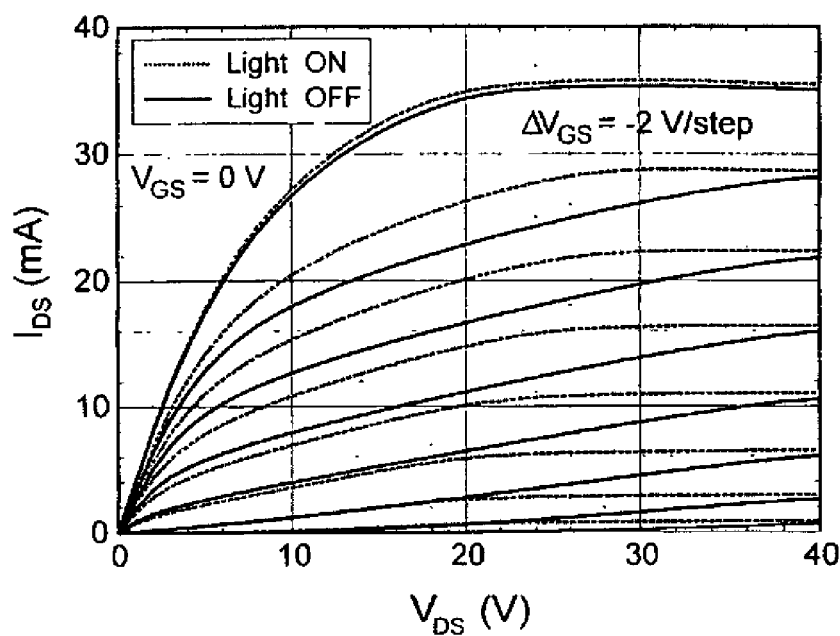
Figure 15-a
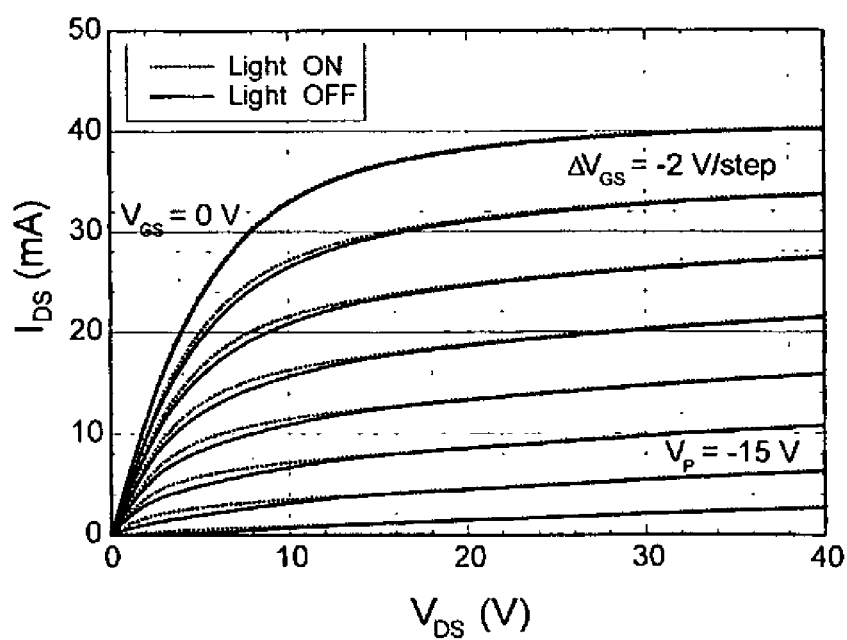
Figure 15-b

HIGH RESISTIVITY SILICON CARBIDE SINGLE CRYSTAL

BACKGROUND OF THE INVENTION

1. Field of the Invention

The present invention relates to a high resistivity silicon carbide single crystal from which substrates for the processing of high frequency semiconductor devices such as MESFETs can be made. The composition of the high resistivity substrates is chosen so that trapping effects deteriorating the performances of the devices are eliminated. The invention also relates to silicon carbide substrates which have a high resistivity before being processed and are able to maintain a high resistivity after processing steps involving heating at temperatures above 1500° C.

2. Background and Prior Art

Semi-insulating, or high resistivity, silicon carbide (SiC) substrates are required for the fabrication of SiC and III-N power microwave devices with low RF losses. SiC devices with power densities exceeding those of GaAs and Si LDMOS technologies have been realized, however, there are still a number of issues that need to be addressed in order to realize the full potential of SiC based microwave technologies. For example, the density of electrically active defects present in the semi-insulating substrate can influence the characteristics of high-frequency SiC devices by inducing device parasitic trapping effects, also known as backgating effects. Semi-insulating SiC substrates can also have a higher micropipe density than conductive substrates and tend to suffer lower crystal growth yields.

In the prior art, essentially two methods are disclosed for the manufacturing of high resistivity ($\rho \geq 10^5$ $\Omega \cdot$cm) SiC crystals. In the first method, described by U.S. Pat. No. 5,611,955, deep levels are introduced during the crystal growth by doping silicon carbide with a heavy or transition metal such as vanadium, or a combination of a transition metal and an electrically passivating impurity such as hydrogen, chlorine and fluorine. In the disclosed invention, the passivating impurities are proposed to neutralize the concentration of shallow donors and acceptors.

In the second method, described by U.S. Pat. No. 6,218,680 B1 (hereafter referred to as '680), intrinsic point defects are introduced during the silicon carbide growth to compensate the dominating type of shallow acceptor or donor dopants, whereas the concentration of heavy metals or transition elements dopants is kept as low as possible, in such a way that they do not affect the electrical properties of the silicon carbide crystal. For example, '680 cites a concentration of $5 \times 10^{16}$ cm$^{-3}$ for the shallow nitrogen dopant and a concentration below $10^{14}$ cm$^{-3}$, or below the detection limit of analytical measurements, for the vanadium transition metal.

It is now quite well established that producing semi-insulating silicon carbide crystal by vanadium doping can in certain practical situations lead to detrimental side effects such as a deterioration of the crystal quality and low process yields. For example, if the vanadium concentration incorporated into the crystal is too high and exceeds the solubility limit of vanadium in SiC ($3-5 \times 10^{17}$ cm$^{-3}$, see Jenny J. R. et al., Appl. Phys. Lett 68(14), p. 1963 (1996)), additional micropipes defects and vanadium rich precipitates are created (see Balakrishna V. et al., Mat. Res. Soc. Symp. 572, p. 245 (1999) and Bickermann M. et al., J. Cryst. Growth 233, p. 211 (2001)).

The complications related to a high concentration doping of transitions metals such as vanadium are overcome in patent '680 which introduces the use of points defects, or "intrinsic defects", as deep levels to compensate the free carriers introduced in the crystal by the shallow donors or acceptors.

There are a number of native point defects, such as vacancies, antisites and interstitials, that could be present in a crystal. In the silicon carbide compound semiconductor, both a silicon vacancy ($V_{Si}$), the absence of a Si atom at a Si-site of the perfect crystal lattice, and similarly a carbon vacancy ($V_C$) can occur. Two antisite defects, the silicon antisite ($Si_C$) resulting from the incorporation of a Si atom at a C-site of the crystal lattice and the carbon antisite ($C_{Si}$) are possible. Similarly, two interstitials, $I_{Si}$ and $I_C$, can result from the misplacement of either a silicon or a carbon atom from a lattice site to a position in between two or more perfect lattice sites. Pairs, complexes and precipitates of these intrinsic defects may also be formed. It is however to date not practically clear by which method the formation of a specific type of intrinsic defect can be either enhanced or suppressed during the crystal growth process itself.

However, certain intrinsic defects can be thermally unstable and if used in a semi-insulating silicon carbide substrate, the resistivity of the substrate may not be well controlled under certain conditions. For example, it has been reported that the silicon vacancy can be annealed out when the silicon carbide crystal is subjected to a sufficiently long high temperature treatment.

In Schottky gate field effect transistors (MESFETs) processed on semi-insulating silicon carbide substrates prepared from crystals grown with a different composition than the preferred embodiments of the disclosed invention, it has been observed that traps present in these substrates can cause a collapse of the MESFET drain-source current. This current collapse is for example visible after application of a high drain-source voltage and can be reversed either by applying heat or a light source to the device, so that the trapped carriers are released (FIG. 15a). This effect deteriorates the device characteristics, as the device is unstable and has a power handling capability lower than what it is designed for. Drain current collapse has also been encountered in GaN MESFETs and AlGaN/GaN HEMTs, and undesired steady-state and transient phenomena have more extensively been studied in GaAs RF devices. In particular, traps present in semi-insulating GaAs substrates, such as the EL2 antisite deep-donor or the Cr deep-acceptor, have been shown to affect the characteristics of compound devices.

PURPOSE AND SUMMARY OF THE INVENTION

The purpose of the invention is to provide a high resistivity silicon carbide substrate with electrical properties and structural quality suitable for subsequent device manufacturing, such as for example SiC or nitride based high frequency devices, so that the devices can exhibit stable and linear characteristics.

Another purpose of the invention is to provide a high resistivity silicon carbide substrate having a low density of structural defects and a substantially controlled uniform radial distribution of its resistivity.

A further purpose of the invention is to provide a silicon carbide substrate with a resistivity which does not decrease below $10^5$ $\Omega \cdot$cm at room temperature after various processing steps involving heating the substrate at a high temperature, such as a temperature of 1500 to 1700° C. as used during epitaxial growth of silicon carbide.

It is a still further purpose of the invention to provide a method for reproducibly controlling the resistivity of the substrate by controlling the type of electrically active intrinsic defects introduced into the crystal during the growth process.

These purposes can be realised by a high resistivity silicon carbide crystal containing a suitable combination of deep levels of intrinsic nature and of extrinsic nature. The combination of intrinsic defects as vacancies and antisites and of extrinsic defects as dopants is adjusted so that the electrical behaviour (either acceptor or donor) of the extrinsic defects is opposed to the one (donor or acceptor, respectively) of the intrinsic defects desired to control the position of the semiconductor's Fermi level.

To provide a high resistivity silicon carbide substrate, the concentration of nitrogen donors is preferably kept below $10^{16}$ cm$^{-3}$, the crystal is doped with a deep acceptor such as titanium at a concentration preferably below $5\times10^{15}$ cm$^{-3}$ so that intrinsic defects as for example, carbon vacancies deep donors, are introduced into the crystal to compensate the deep and shallow acceptors.

BRIEF DESCRIPTION OF THE DRAWINGS

FIG. 15: DC I–V characteristics under 40V $V_{DS}$ stress with and without illumination of MESFETs processed on (a) a prior art 4H—SiC substrate and (b) on a substrate of the invention.

DETAILED DESCRIPTION OF THE INVENTION

Figure 1:
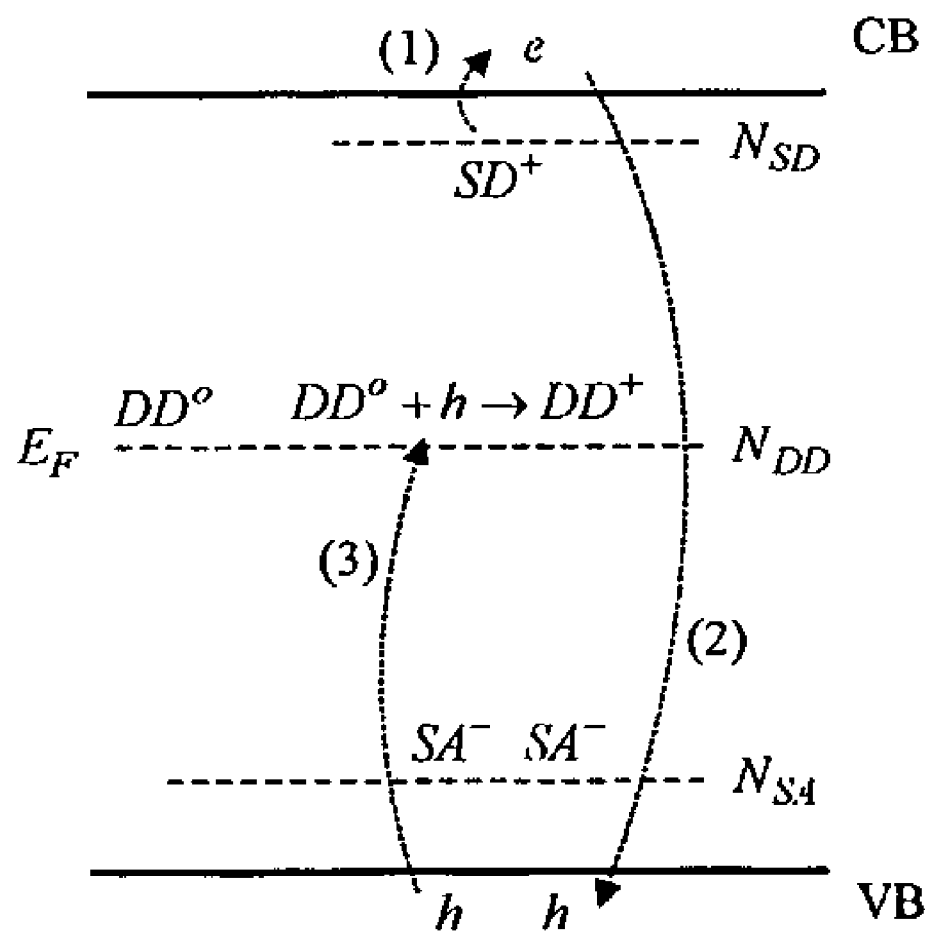
FIG. 1 illustrates the energy band models for an example of prior-art compensation mechanism to make a semiconductor crystal semi-insulating, where shallow donors SD are compensated by shallow acceptors SA, which are overcompensated by deep donors DD.

The presence of trap related drain current collapse in SiC MESFETs and the higher micropipe density often encountered in vanadium doped substrates motivate the development of high-resistivity substrates with a controlled composition minimizing the concentration of detrimental traps.

This requires crystal growth processes using a pure growth environment. In the High Temperature Chemical Vapour Deposition (HTCVD) technique, where the source material is in-situ synthesised from purified gas precursors, the gas phase composition can be controlled to either decrease the incorporation of undesirable impurities or, as it will be shown, to promote the incorporation of specific extrinsic and intrinsic defects. At the same time, the composition of the crystal needs to be controlled to provide the necessary mechanisms to maintain its resistivity at a value useful for microwave device applications.

The basic method to grow a high resistivity crystal, which applies to silicon carbide and other semi-conductors of technological importance, such as gallium arsenide, is outlined in the following. It will first be illustrated in the prior art of U.S. Pat. No. 5,611,955.

In this description, the terms donor and acceptor levels are used as commonly defined in semiconductors physics. A donor D level has a neutral charge state D° if filled by an electron and a positive charge state D$^+$ if ionised. A shallow donor SD, introduced intentionally or not into the semiconductor, releases at room temperature a substantial amount of free carriers (electrons) into the conduction band according to:

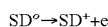

Conversely, a shallow acceptor SA has a neutral charge state SA° if filled and a negative charge state SA$^-$ if ionised, and creates free carriers in the valence band, holes, according to:

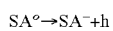

Such shallow levels can be introduced in silicon carbide by, without being restricted to, the nitrogen impurity and the aluminum or boron impurities.

Deep levels in a semiconductor generally describe levels further away from the bands and thus able to only create a few order of magnitude lower number of free carriers.

Instead, depending on their charge state, they can capture both types of free carriers. For example neutral deep donors DD can trap holes, or emit electrons according to

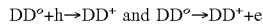
$DD^\circ + h \rightarrow DD^+$ and $DD^\circ \rightarrow DD^+ + e$

Conversely, a deep acceptor, being either neutral or negatively charged, acts as an efficient free electrons trap or a small source of free holes:

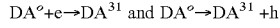
$DA^\circ + e \rightarrow DA^{31}$ and $DA^\circ \rightarrow DA^{31} + h$ For technological reasons, it is in practice difficult to completely prevent a shallow level to be introduced to some extent during the crystal growth process. It is well known to those familiar with the technology of silicon carbide single crystal growth, that nitrogen is an impurity difficult to eliminate from the growth environment. Even in the purest growth techniques presently available, such as Chemical Vapour Deposition (CVD), nitrogen concentrations close to, or above, $10^{13}$ cm$^{-3}$ have to date been unavoidable. In crystal growth processes, where temperatures above 2000° C. are used in order to obtain economically interesting growth rates, the outgassing of nitrogen from solid parts exposed to the high temperatures becomes even more efficient than at the lower temperatures used in CVD. For example, even in halogen purified graphite, which is one of the materials commonly used in silicon carbide crystal growth, nitrogen can be present with concentration up to approximately $10^{18}$ cm$^{-3}$. In the Physical Vapour Transport (PVT), or sublimation, method used for silicon carbide crystal growth, the solid silicon carbide source material is also a source of nitrogen. Even in CVD grown silicon carbide powders nitrogen concentration of $10^{18}$ cm$^{-3}$ has been reported.

As illustrated in FIG. 1, deep levels such as vanadium have been used to compensate the dominating shallow levels. For example, the electrons created by the shallow nitrogen (arrow (1) in FIG. 1) are compensated by an excess (intentional or not) of shallow acceptors so that all electrons are recombined (2) with the holes introduced by the acceptors. If the acceptors have a shallow character such as aluminium, the resistivity of the crystal is low and is controlled by the concentration of holes $h = N_{SA} - N_{SD} = [Al] - [N]$ by the relation $\rho = 1/(\alpha \cdot h \cdot e \cdot \mu)$, where $\alpha$ is a thermal activation coefficient reflecting the energy position of the shallow acceptors and $\mu$ the mobility of the holes. In order to make the crystal semi-insulating a deep donor level such as the vanadium $(D^+/D^0 = V^{5+}/V^{4+})$ level needs to be introduced at a sufficient concentration to overcompensate all the free holes (3). In order to obtain a high resistivity of technological interest, the concentration $N_{DD}$ of deep donors is chosen to satisfy:

$N_{DD} > N_{SA} - N_{SD} > 0$ so that the Fermi level is pinned at the deep donors level: the ionised concentration of donors $(N_{DD+} = N_{SA-} - N_{SD+})$ acts as electron traps and the remaining neutral donors concentration $(N_{DD0} = N_{DD} - N_{DD+} > 0)$ as hole traps.

This method may be summarised by the three following rules:
1) the crystal should be as pure as possible with a concentration of residual shallow donors $(N_{SD})$ or shallow acceptors $(N_{SA})$ as low as feasible.
2) deep levels need to be present in the crystal in order to capture the free carriers originating from the dominating shallow dopant. The deep levels shall act either, as acceptors if the free carriers are electrons $(N_{SD} > N_{SA})$, or as donors if the residual free carriers are holes $(N_{SA} > N_{SD})$
3) in order to obtain an homogeneously high resistivity crystal, the density of the active deep levels shall exceed the residual doping set by the shallow levels everywhere in the crystal.

Although not desirable, the need of introducing vanadium with higher concentrations than might be optimal for the crystal quality and the process yield, is set by these rules. As is the case in prior art, the residual doping of a pure, grown by the PVT technique, crystal is generally n-type with nitrogen concentration in the range $5 \times 10^{16}$ to $10^{17}$ cm$^{-3}$. These shallow donors can be compensated by Aluminum with $[Al] > [N]$. The holes are in turn overcompensated by deep donors levels introduced by the vanadium doping with $[V] > [Al] - [N]$.

When only intrinsic defects are used, their concentration must exceed the net difference of shallow donor and acceptors present in the crystal. There can however be practical cases where this condition is not sufficient. If the electrical nature (either deep acceptor or deep donor) of the intrinsic defect cannot be controlled during the crystal growth process, a situation where the intrinsic defects do not enable to achieve a high resistivity stable upon annealing can occur. For example, deep donor intrinsic defects cannot compensate a crystal where the shallow donors concentration exceeds the shallow acceptors concentration: the second rule described above is not satisfied. The resistivity of the crystal is then controlled by the net difference of shallow donors and shallow acceptors concentrations and the intrinsic donor defects have no effect on the electrical properties.

It is the object of the present invention to provide a composition to use for producing semi-insulating silicon carbide crystals with properties matching the requirements necessary for fabrication of high frequency devices. The compositions described hereafter enable the manufacturing of semi-insulating silicon carbide substrates which remain of high resistivity after processing steps needed for the device fabrication, as for example, epitaxial deposition of the active MESFET structure by CVD. It will also be shown that the composition of such substrates prevents trapping effects of free carriers injected during MESFET device operation. The invention enables to operate the device at higher current than devices processed on prior art semi-insulating silicon carbide and thereby to extract a higher electrical power output from the device.

Although the description of the semi-insulating crystals composition is illustrated for the 4H polytype, or lattice variant, of the silicon carbide crystal, it is clear that the method can also be used to grow high resistivity crystals of other polytypes such as for example 6H, 15R or 3C. The method is illustrated for crystals grown along, or near to, the c-axis of the crystal lattice, however it may also be used for crystals grown along other directions, as for example the so-called a-directions, such as the $[11\bar{2}0]$ or $[10\bar{1}0]$ directions.

The invention can be characterised by the use of deep levels introduced by a controlled amount of electrically active deep impurities so that certain intrinsic deep levels are selected to control the resistivity of the crystal.

To prevent a performance deterioration of devices processed on silicon carbide crystals prepared according to this invention by the trapping effect described earlier, the concentration of shallow donors and/or shallow acceptors in the grown crystal is kept as low as needed, preferably below $1 \times 10^{16}$ cm$^{-3}$. The term shallow dopants includes here dopants introduced intentionally or not during the growth process, in the form of impurities (i.e. not Si and C atoms), or of electrically active defects as shallow levels created by either intrinsic defects or by crystal defects as dislocations and stacking faults. Furthermore, the concentration of each deep donor and deep acceptor level introduced, intentionally or not, in the form of impurities is also kept below $10^{17}$ cm$^{-3}$. According to a preferred embodiment of the invention, the concentration of intentionally introduced deep levels in the form of impurities, such as transition metals, is kept below $5 \times 10^{15}$ cm$^{-3}$.

Figure 2:
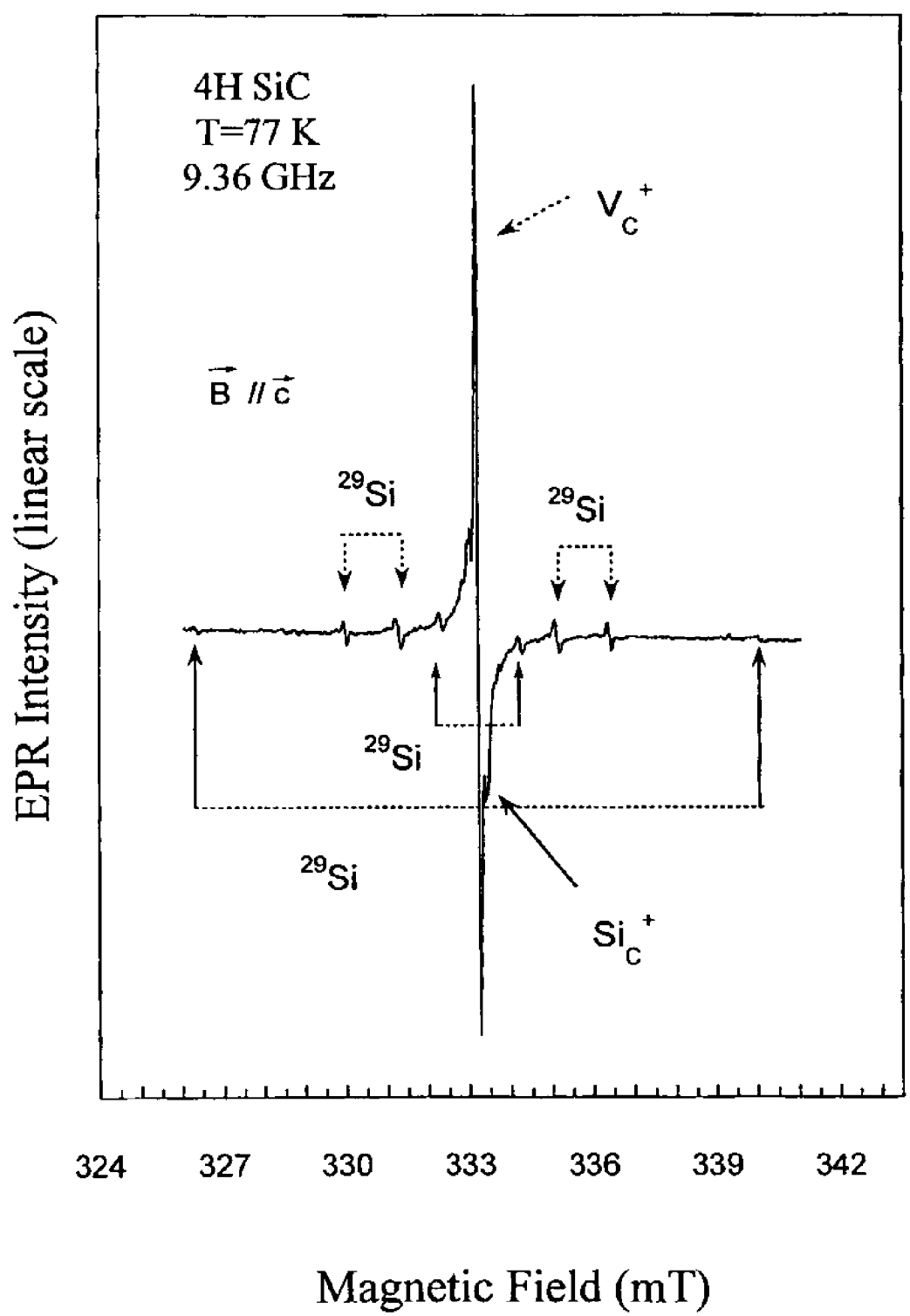
FIG. 2: EPR spectrum measured at 77° K at X-band frequency of a 4H—SiC crystal with a room temperature $\rho > 10^6$ Ω·cm, identifying the presence of two intrinsic defects in the positive charge state: the carbon vacancy ($V_C^{3o}$) also called EI5 center, and the silicon antisite ($Si_C^+$), also called EI6 center.
Figure 3:
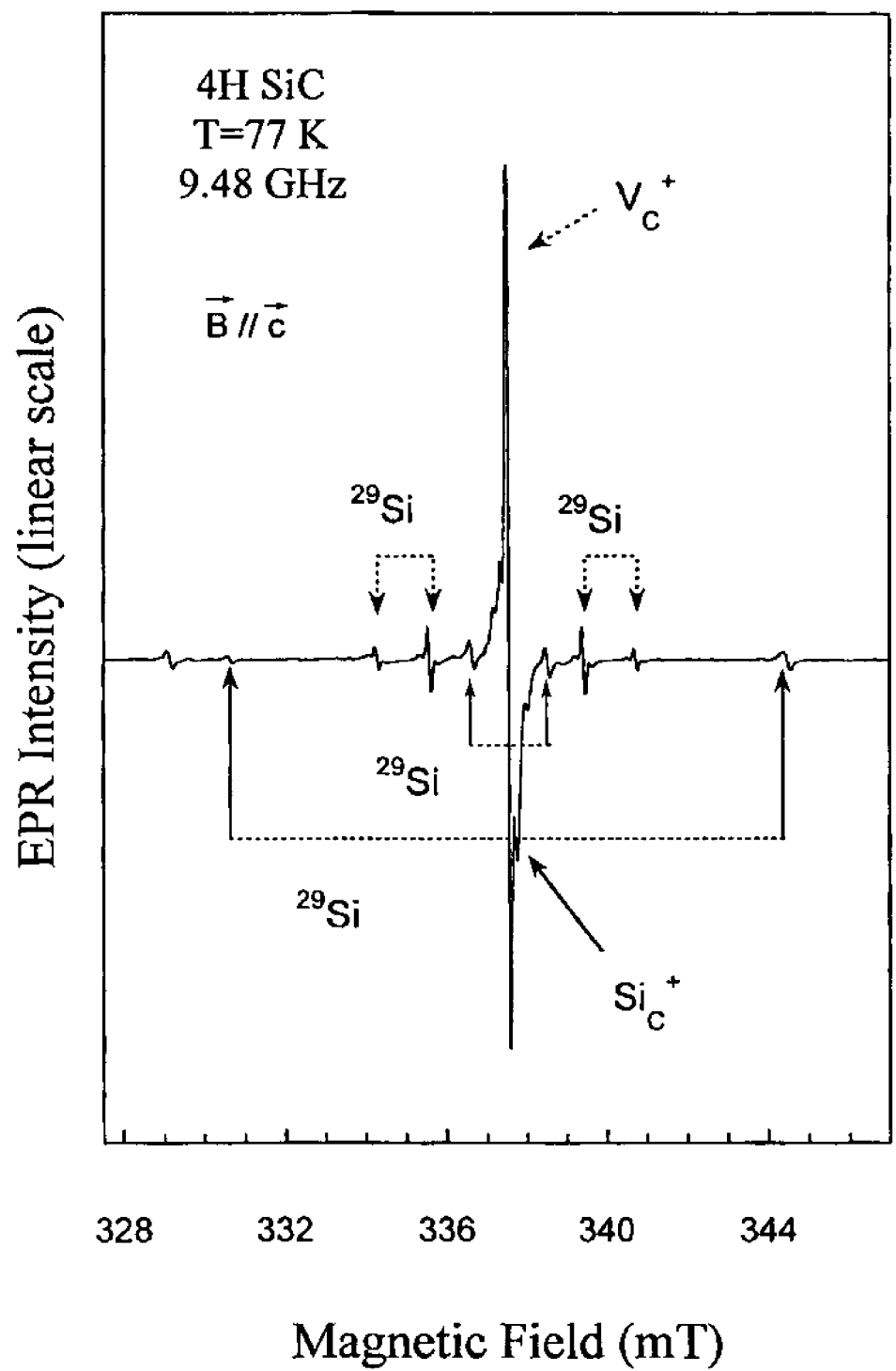
FIG. 3: EPR spectrum measured at 77° K at X-band frequency of an electron irradiated p-type 4H—SiC crystal, with a higher concentration of the carbon vacancy ($V_C^+$) and the silicon antisite ($Si_C^+$) defects.

FIG. 2 shows the Electron Paramagnetic Resonance (EPR) spectrum measured on a high resistivity 4H silicon carbide crystal prepared according to the invention. The spectrum identifies the presence of two deep donors positively charged, that is having captured a hole: the EI5 line of the carbon vacancy ($V_C^+$) and the EI6 line of the silicon antisite ($Si_C^+$). The relative intensity of the two sets of lines shows that the concentration of $Si_C^+$ centers is several times smaller than the one of the $V_C^+$ centers. The spectrum of FIG. 2 shows the same structure as the EPR spectrum of FIG. 3, which is measured on a reference p-type doped SiC crystal ([Al]~$10^{18}$ cm$^{-3}$) having been irradiatied by a high dose (~$2.10^{18}$ cm$^{-3}$) of electrons . The fact that, the lines identifying the carbon vacancy and silicon antisite defects are weaker in the as-grown high resistivity crystal than in the irradiated p-type crystal, is explained by the much lower concentration of deep donors created during the crystal growth than by electron irradiation.

Figure 4:
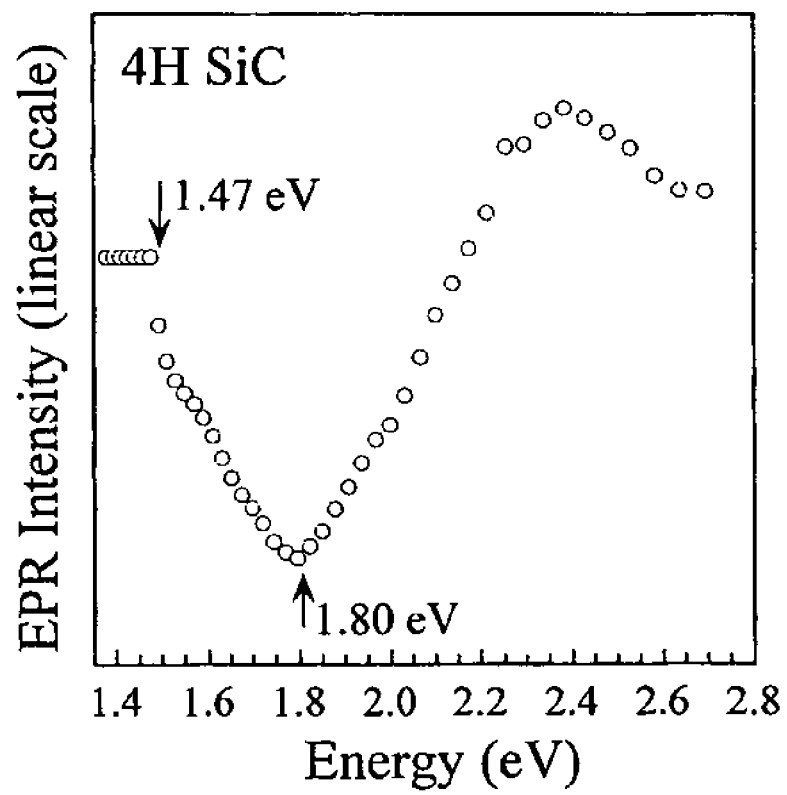
FIG. 4: Variation of the integrated EPR intensity of the carbon vacancy with increasing excitation photon energy. These measurements were performed at W-band frequency (~95 GHz), at which the $V_C^+$ and the $Si_C^+$ signals are well separated.

The position of the deep donor states in the band gap of the silicon carbide crystal has been measured by carrying out an experiment known as photo-EPR. This experiment was done on the reference p-type irradiated 4H—SiC crystal of FIG. 3, where the higher intensity of the EI5 and EI6 lines allows an easier and more reliable measurement than on the as-grown crystal. The measurements were carried out at W-band frequency at which the EI5 and EI6 lines are well separated. Examples of the spectra with separated $V_C^+$ and the $Si_C^+$ signals can be found in Son N. T. et al. "Silicon antisite in 4H—SiC" Phys. Rev. Lett. 87 (2001), 045502 and in Son N. T. et al. "Carbon vacancy-related defect in 4H and 6H SiC", Phys. Rev. B 63 (2001) R201201). FIG. 4 shows that the EPR intensity of the carbon vacancy line decreases when the excitation light energy exceeds about 1.47 eV. This shows that the center is gradually filled by electrons according to:

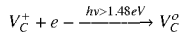

When the excitation light energy exceeds about 1.8 eV, the EPR intensity of the line increases again, showing that above 1.8 eV the center is returning to its positive charge state, i.e. is emptied of electrons according to the reverse reaction:

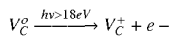

Figure 5:
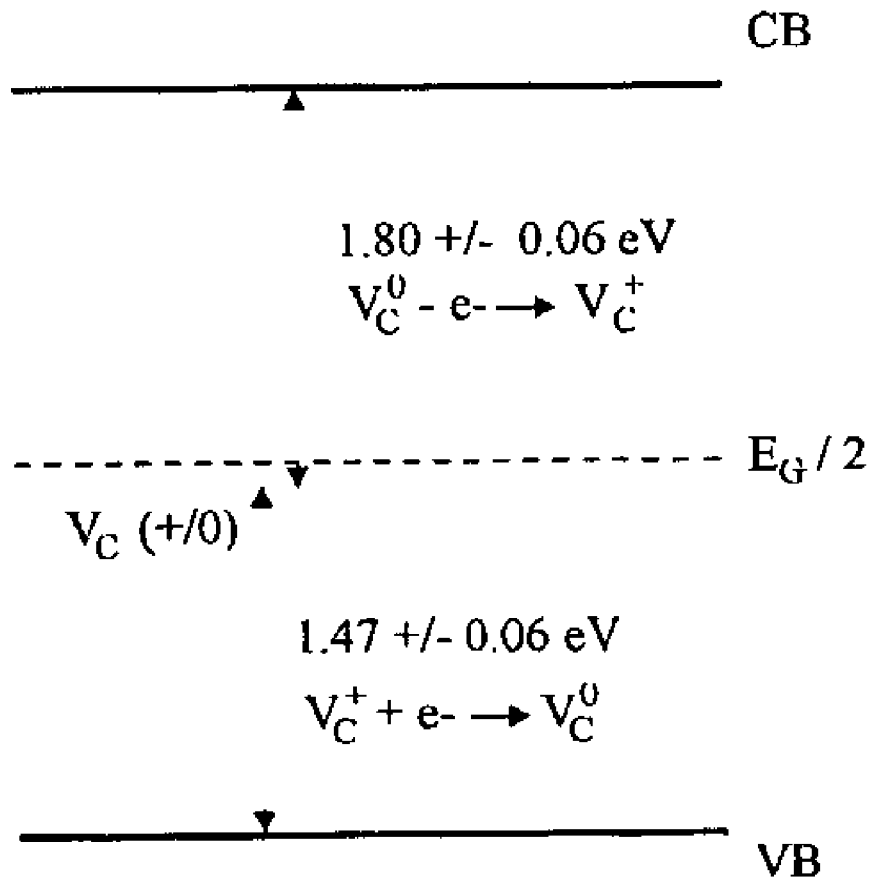
FIG. 5: Energy band models for the carbon vacancy deep level in a 4H—SiC crystal.

It shall be noted that, the two threshold energies required to fill (~1.47 eV) and empty (~1.8 eV) the intrinsic defect add up, within the experimental error of the experiment and a small Franck-Condon shift, to the band gap of the 4H silicon carbide polytype (3.26 eV). A similar experiment carried out on the 6H polytype shows the same result, with two threshold energies (1.35 eV and 1.53 eV) adding up to the smaller band gap of the 6H crystal structure (2.9 eV). These results allow to position the carbon vacancy center in the lower half of the band gap of the 4H polytype, circa 1.47 eV above the edge of the valence band (FIG. 5). Being either neutral (undetected in EPR) or positively charged, the carbon vacancy intrinsic defect is identified as a deep donor in the silicon carbide semiconductor. The silicon antisite center is also a deep donor, however its energy level has not yet been conclusively determined. As its concentration is, as mentioned earlier, several times smaller than the one of the carbon vacancies, the precise positioning of the silicon antisite level is also of less importance for the purpose of this invention.

Following the second rule exposed earlier, a silicon carbide crystal containing deep levels introduced by intrinsic defects or impurities will become semi-insulating only if the deep levels compensate the shallow levels. Photoluminescence measurements in the energy region near the band edges show that nitrogen is always incorporated to some extent into the crystals prepared according to this invention. The growth conditions are however adjusted so that the nitrogen concentration is kept preferably low. Secondary Ions Mass Spectroscopy (SIMS) measurement carried out on a crystal with the composition of the crystal described in FIG. 2 shows a nitrogen concentration less than $10^{16}$ cm$^{-3}$, which was the detection limit of the SIMS measurement for this species. In presence of only deep donors introduced by the carbon vacancy and the silicon antisite, a crystal with a nitrogen concentration as low as $10^{16}$ cm$^{-3}$ is not of high resistivity: neutral carbon vacancies alone cannot trap the free electrons introduced by the nitrogen.

The introduction of aluminium shallow acceptors may seem to provide the missing composition to allow the deep intrinsic donors to satisfy the relation of FIG. 1:

$N_{DD} > N_{SA} - N_{SD} > 0$ with $N_{SA} - N_{SD} = [Al] - [N] > 0$

However, it has been found that this procedure requires to very precisely control the concentration of shallow acceptors introduced in the crystal. Any introduction of shallow acceptors greater than the concentration of as-grown deep intrinsic donors will cause the resistivity to be controlled by the aluminium concentration and the crystal to turn into p-type conductivity.

To overcome this difficulty, the invention provides the introduction of deep acceptor levels provided by an electrically active impurity with concentration $N_{DA}$ so that the relation:

$N_{DD} > N_{DA} + N_{SA} - N_{SD} > 0$ is satisfied with $N_{SD} = [N]$ and for example $N_{DA} \geq [Ti]$ and $N_{DD} \geq [V_C] + [Si_C]$ It is found that a transition metal, such as titanium, is a suitable impurity to control the resistivity of the crystal. It is also found that in presence of titanium, intrinsic defects such as for example, the carbon vacancy, can be detected in EPR as shown in FIG. 2.

Figure 6:
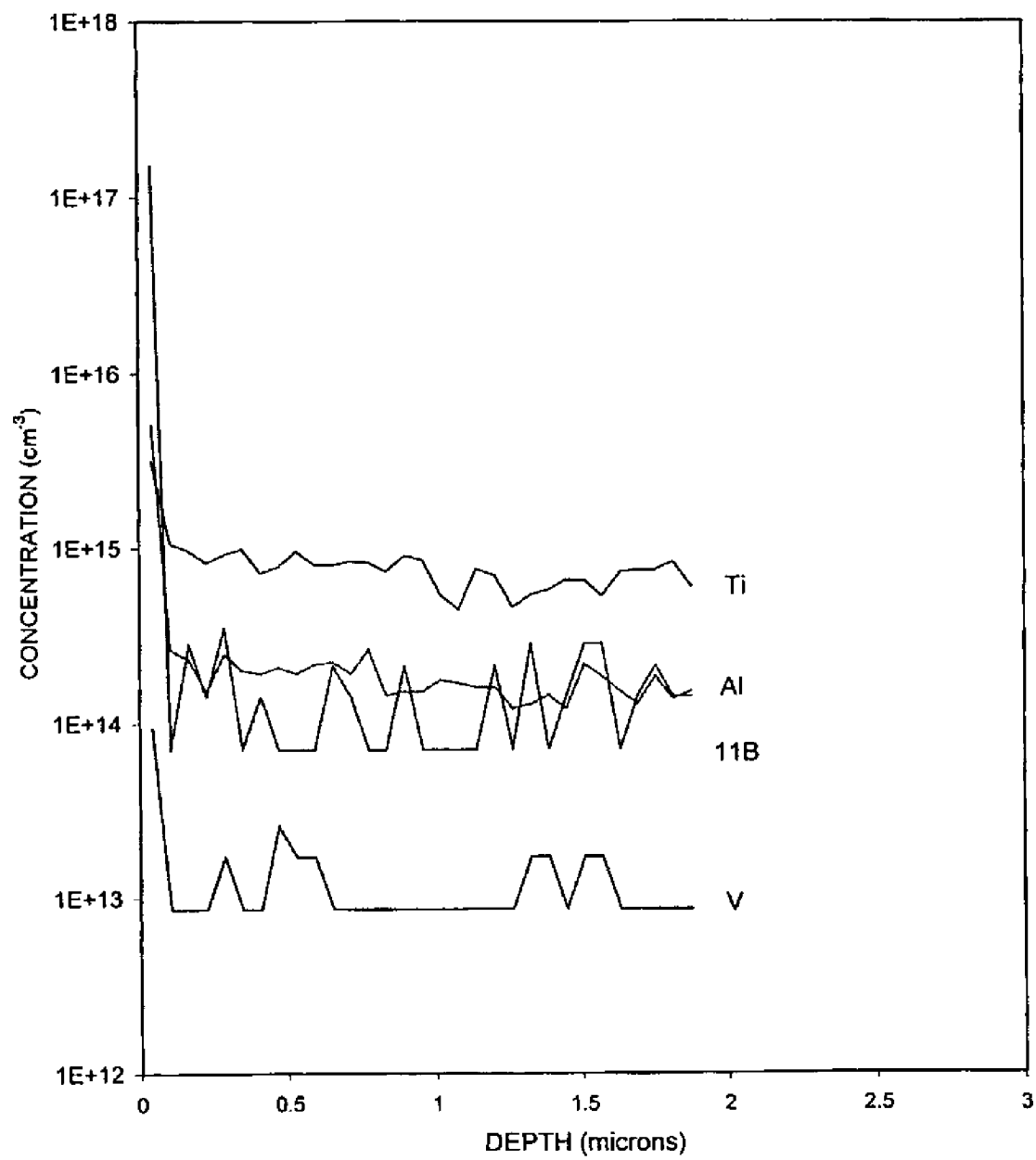
FIG. 6: Atomic concentrations of various element measured by Secondary Ion Mass Spectrometry (SIMS) on a crystal prepared according to this invention.
Figure 7:
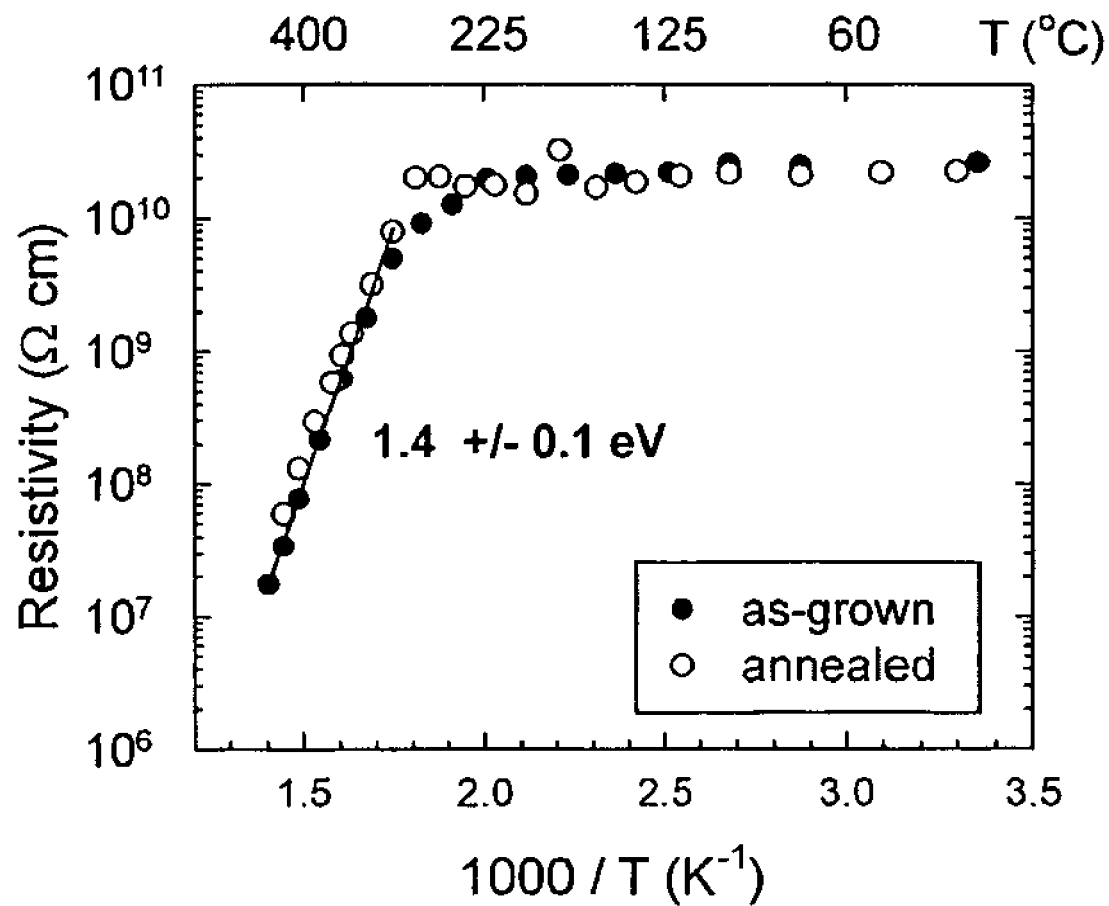
FIG. 7: Temperature dependence of the resistivity measured on an as-polished 4H—SiC substrate sliced from a crystal grown under conditions leading to the incorporation of titanium deep acceptors and intrinsic defects such as carbon vacancies and silicon antisite deep donors.

Accordingly, FIG. 6 shows the SIMS profile of a crystal containing the carbon vacancy and silicon antisite deep donors and a titanium concentration less than $10^{16}$ cm$^{-3}$ but higher than the concentrations of aluminium and boron (which are both less than $5 \times 10^{14}$ cm$^{-3}$ in this example). The high resistivity of crystals manufactured under the composition of the invention has been reproducibly verified to be above $10^5$ Ω·cm at room temperature. Electrical current-voltage measurements using two annealed metallic contacts processed on the front and backside, respectively, of polished substrates sliced from such crystals show a room temperature resistivity in the range of $10^7$ to above $10^{11}$ Ω·cm. Hall measurements have also been used to confirm the semi-insulating nature of these crystals. The temperature dependence of the resistivity extracted from the current-voltage measurements shows that the thermal activation energy is around 1.4+/−0.1 eV in such crystals (FIG. 7).

This activation energy value, is within the experimental error, the same as the energy position above the valence band of the carbon vacancy defect as determined in FIG. 4. This result provides a confirmation of the semi-insulating nature of the crystal doped with a deep acceptor impurity, where the Fermi level is pinned at a deep donor intrinsic defect.

Figure 8:
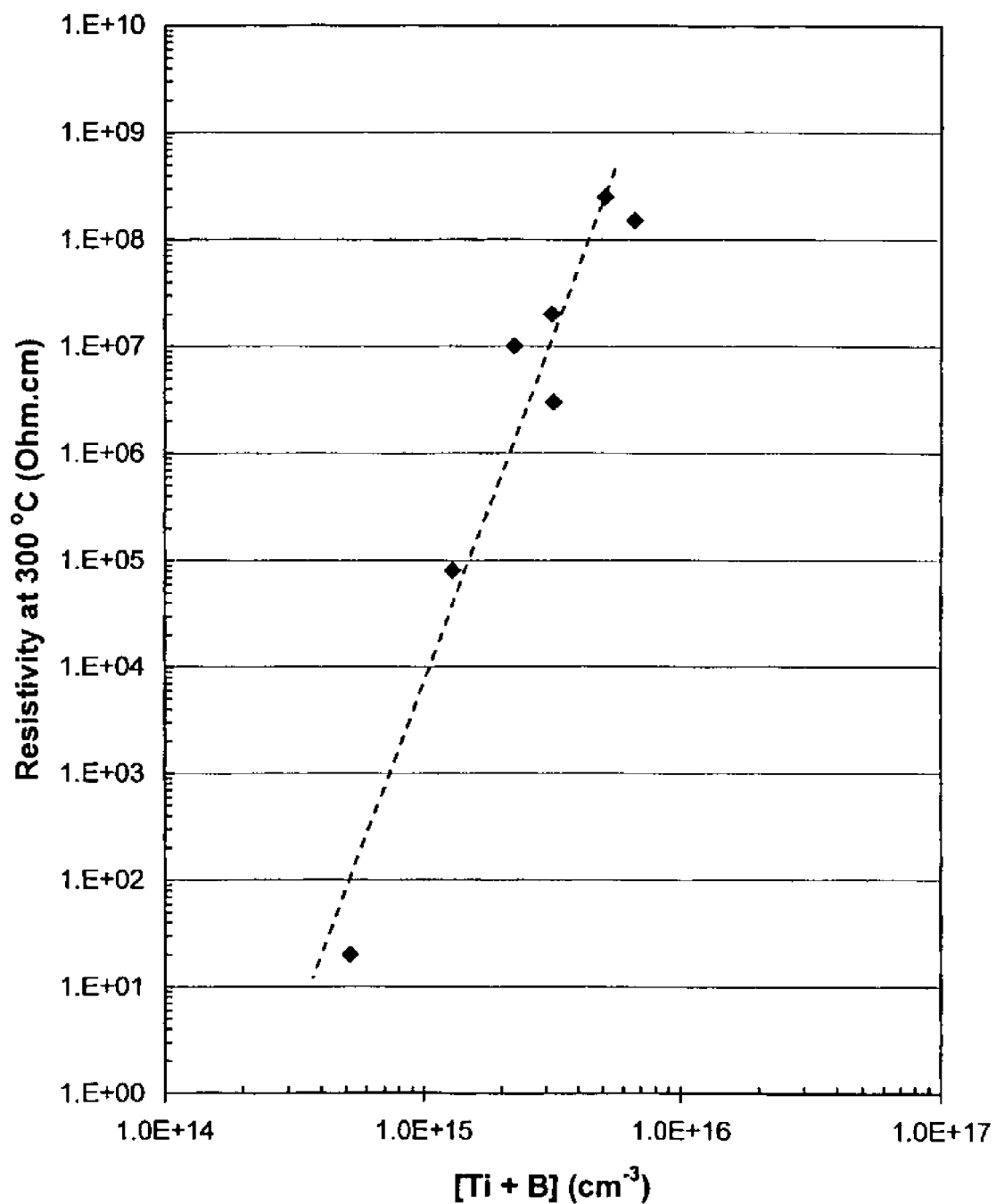
FIG. 8: Resistivity dependence with the SIMS concentration of Ti and B in various crystals containing intrinsic defects such as the carbon vacancy. The resistivity values are measured at 300° C.

In a first preferred embodiment, the total concentration of deep level acceptors introduced in the crystal, comprising at least the residual deep boron (energy level at circa 600 meV above the valence band) and a deep acceptor introduced by for example a transition metal such as titanium, is varied to control the resistivity of the crystal. FIG. 8 displays the relationship between the resistivity and the sum of the atomic concentration of titanium and boron in a plurality of such crystals.

The control of the resistivity, although illustrated for the titanium deep acceptor impurity, can as well be achieved by other suitable dopants acting a deep acceptors. Earlier EPR and DLTS measurements have shown that chromium (Cr), tungsten (W) are also transition metals producing deep acceptor levels. Depending on the concentration and electrical nature of the residual shallow dopants, impurities such as scandium (Sc), oxygen (O), manganese (Mg) and molybdenum (Mo) can also be suitable candidates as they are reported to produce shallow and deep acceptor levels. According to the invention, any dopant, selected for example from a transition element of the IIIB, IVB, VB, VIB, VIIB periodic columns, will control the resistivity in combination with deep intrinsic donors, provided the selected dopant produces deep acceptor levels.

Figure 9:
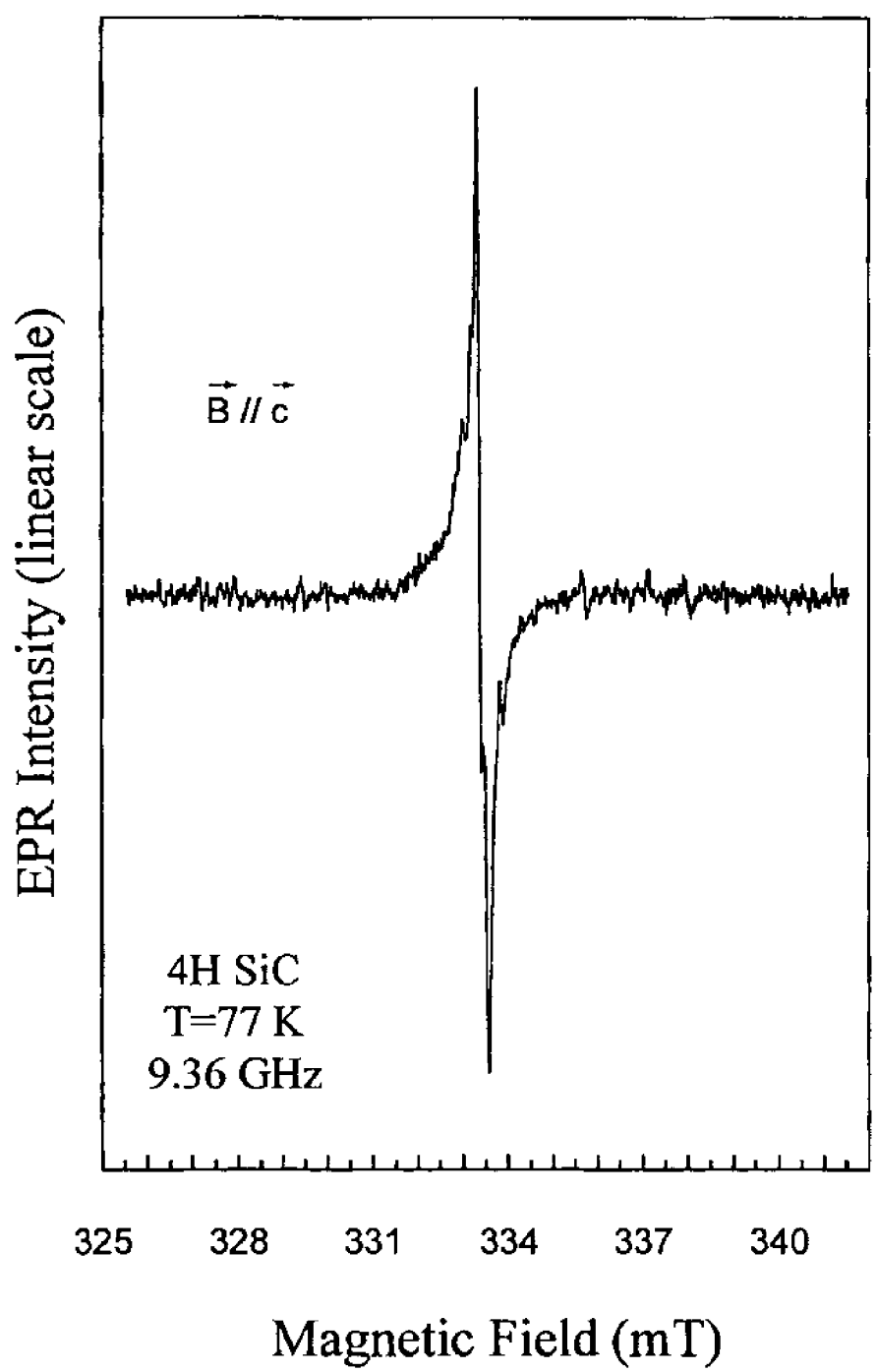
FIG. 9: EPR spectrum measured at 77° K at X-band frequency of a 4H—SiC crystal with a room temperature $\rho > 10^6$ Ω·cm, including silicon vacancy related defects.

The higher accuracy of the control of the resistivity in semi-insulating silicon carbide crystals containing intrinsic defects will now be further illustrated in a example where no titanium is added to a crystal otherwise substantially grown under the same conditions as in the previous example. FIG. 9 shows the EPR spectrum measured on a 4H silicon carbide crystal grown at the same temperature, growth rate and input silicon species concentration as the crystal of FIG. 2. As the growth parameters, according to prior art and publications in principle affecting the type of intrinsic defects created in the crystal, are substantially identical, one would expect such a crystal to also show presence of the carbon vacancy and silicon antisite deep levels. However, the signature of the positive charge states of these two defects is absent in FIG. 9. Instead, the broader line of the EPR spectra of FIG. 9 contains a new defect, identified as the silicon vacancy in its negative charge state. This intrinsic defect has, as opposed to the two deep donors identified in FIG. 2, an acceptor (i.e. electron trap) behaviour according to the reaction:

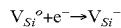

Figure 10:
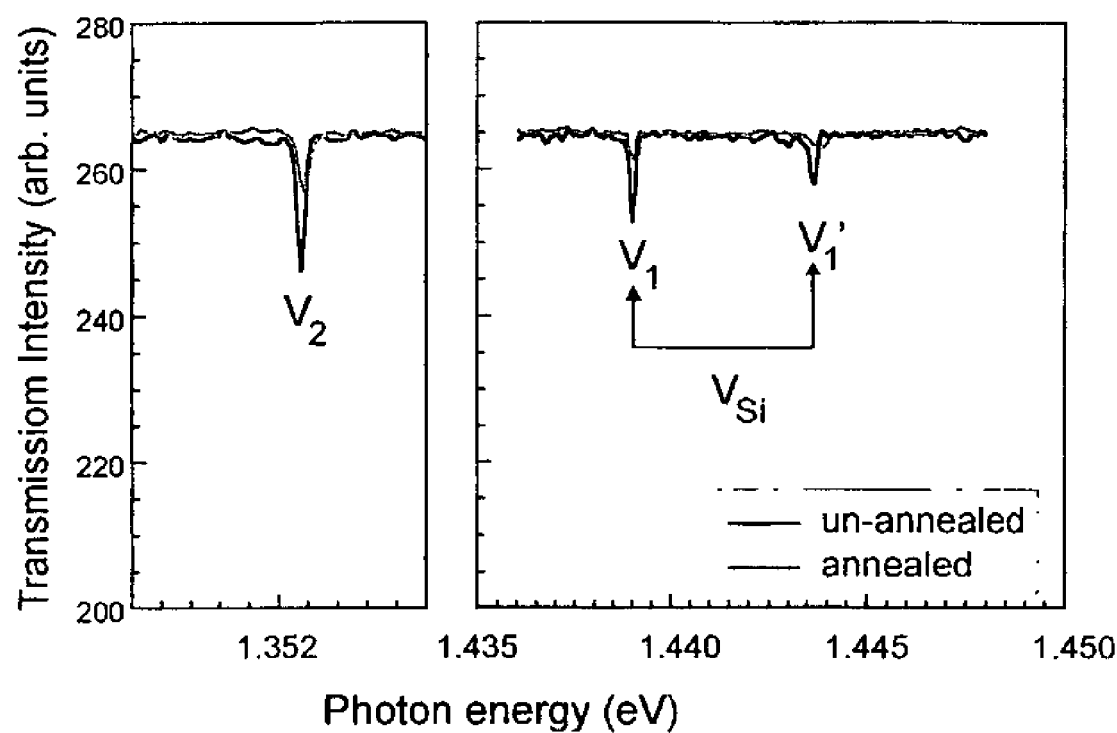
FIG. 10: Infra-red absorption spectra of a high resistivity 4H—SiC crystal grown under the same conditions as the crystal measured in FIG. 9, before and after annealing at 1600° C. The silicon vacancy absorption lines are labelled V1, V1' and V2.

The infra-red absorption spectrum of FIG. 10 confirms this result, where the characteristic absorption lines of the silicon vacancy, labeled V1, V1' and V2, are clearly dominating. As these lines dominate the spectrum, it is also concluded that silicon vacancies are the dominating intrinsic deep level in this crystal.

Figure 11:
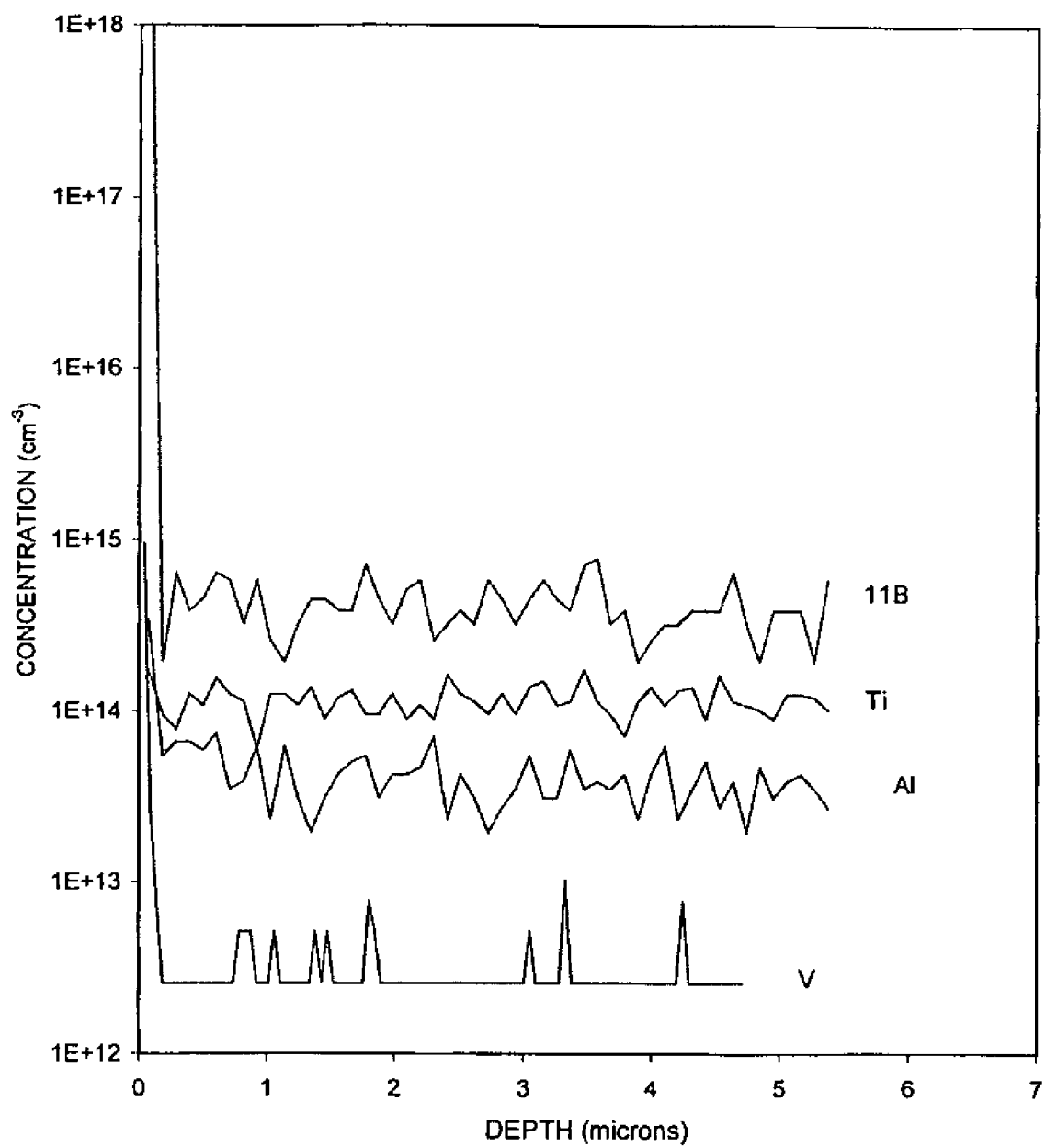
FIG. 11: Atomic concentrations of various element measured by SIMS on a crystal with a mean Ti concentration of ~$1.5\times10^{14}$ cm$^{-3}$

The crystals characterised by the presence of silicon vacancies related defects are of higher purity than the type described in FIG. 2. FIG. 11 illustrates a SIMS profile of the same impurities measured in FIG. 6. It is obvious from this measurement that the concentration of Ti, Al and V metals in about one order of magnitude lower, or at the detection limit of the measurement technique, in this second type of crystal. The concentration of boron is however nearly the same, with a mean [B]~$4\times10^{14}$ cm$^{-3}$ instead of $1.5\times10^{14}$ cm$^{-3}$ in FIG. 6.

Figure 12:
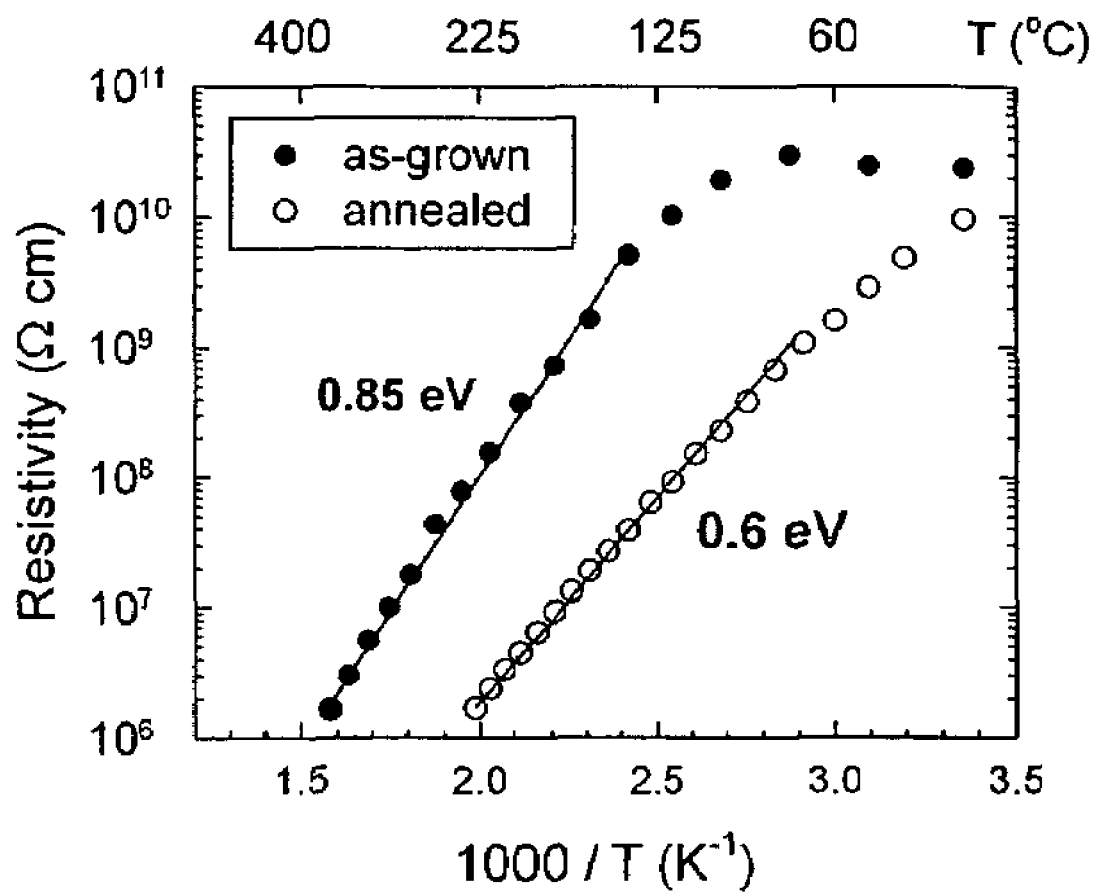
FIG. 12: Temperature dependence of the resistivity measured on a 4H—SiC substrate (as-polished and then annealed at 1600° C.) containing the silicon vacancy deep acceptor and a low concentration of titanium.

Such a crystal is expected to be of high resistivity as the silicon vacancy deep acceptor levels, if at sufficient concentration, compensate the residual shallow nitrogen donors (FIG. 1). However, experience has shown that, even if such crystals can be of high resistivity at room temperature after having been sliced and polished into substrates, the resistivity of these substrates decreases after annealing at a temperature of 1600° C., as used in epitaxial growth by CVD (FIG. 12). The decrease of the resistivity after annealing can be explained by a decreased concentration of silicon vacancies, leading to a lower compensation of the nitrogen donors. The decrease of the silicon vacancy signature after annealing is indeed observed in this crystal by the absorption measurement of FIG. 10. A resistivity decrease after annealing may be acceptable for certain device applications, as long as the substrate resistivity remains above $10^5$ Ω·cm at room temperature.

However, a decrease of the resistivity after annealing at 1600° C. has not been observed by the authors in crystals prepared according to the preferred embodiments of this invention. Instead, the resistivity remains unchanged (FIG. 7). This opposite behaviour to the silicon vacancy signature in the infrared region underlines the beneficial effect of the addition of a deep acceptor such as titanium to stabilise the formation of the desired intrinsic deep levels in the crystal. Also, better MESFET device performances have been measured on devices processed on a silicon carbide crystal prepared according to the first preferred embodiment of this invention.

Figure 13:
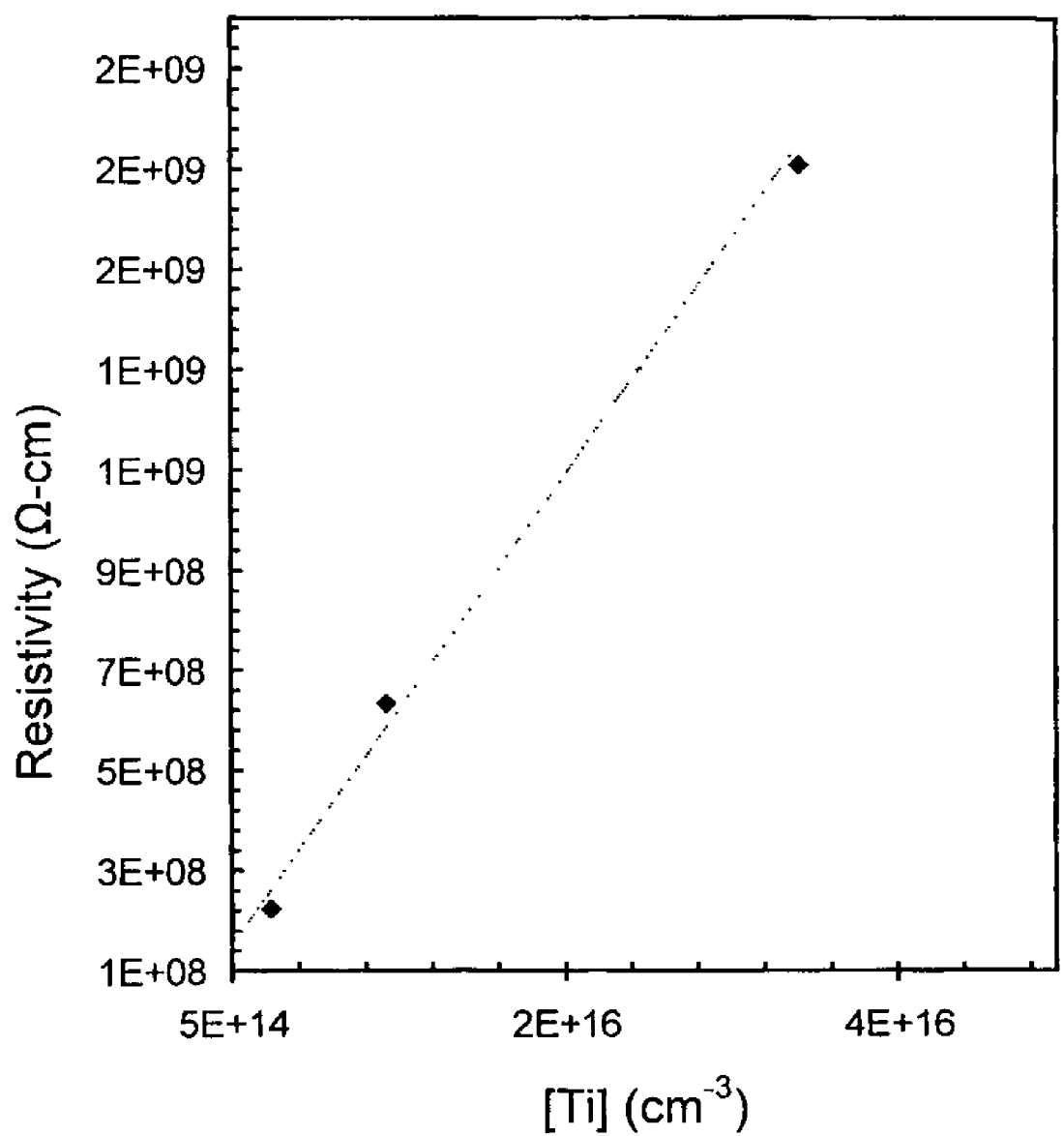
FIG. 13: Dependence of the room temperature resistivity with the titanium SIMS concentration, measured on 4H—SiC crystals grown with increasing Ti incorporation and with constant boron concentration.
Figure 14:
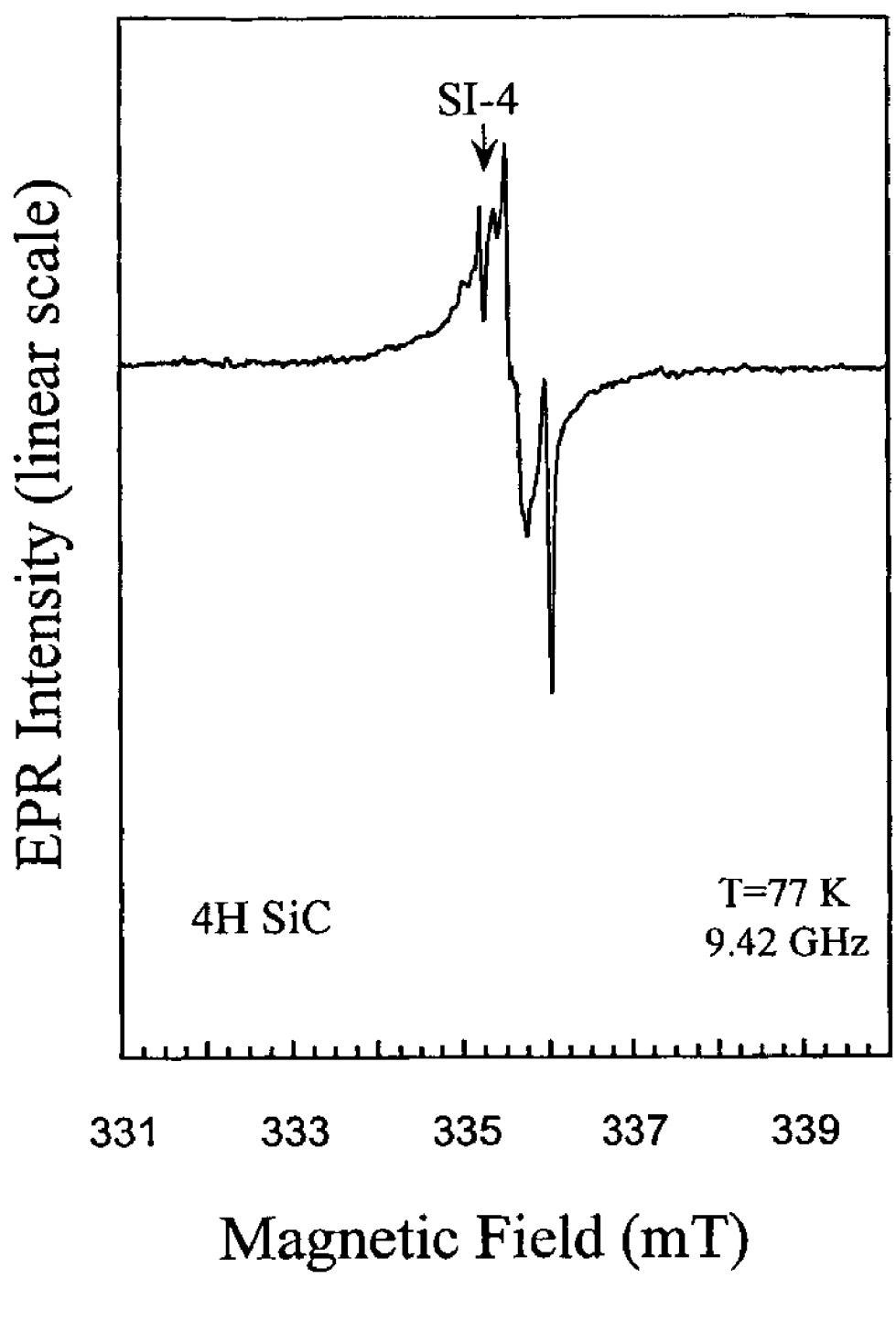
FIG. 14: EPR spectrum measured on a 4H—SiC high resistivity crystal with titanium concentration of $9\times10^{15}$ cm$^{-3}$.

In a second preferred embodiment, the concentration of deep acceptors levels introduced in the crystal by a transition metal such as titanium, is varied, while keeping the boron concentration as low as possible and constant, to promote other intrinsic defects and to control the resistivity of the crystal. The experiments made in the two following figures used higher concentrations of titanium than may be desirable for device applications in order to emphasize the effect on the deep titanium acceptor. FIG. 13 displays the increase of the room temperature resistivity of 4H SiC crystals grown with an increased atomic concentration of titanium while keeping the boron concentration constant. FIG. 14 shows the presence of defects such as the one labeled SI-4 in the EPR spectrum of such a crystal having a titanium concentration of $9\times10^{15}$ cm$^{-3}$. It is worth noting that, without introduction of the titanium deep impurity during the crystal growth, these crystals would have had a Si-vacancy dominating deep level instead of the ones observed in FIG. 14.

It is thus experimentally found that the intentional introduction of a deep impurity such as titanium promotes the formation of certain intrinsic defects, such as for example carbon vacancies. Co-doping during the crystal growth appears thus as an efficient and easy means to control which type of intrinsic deep levels are active in the crystal and thereby control its resistivity.

Although the authors do not wish to be bound by any theory, the changes in the presence of various intrinsic defects in crystals co-doped with deep acceptors impurities such as titanium may be explained by the effects of these impurities during the crystal growth process. As noted earlier, the growth conditions, such as temperature and growth rate are substantially the same in the crystals characterised in FIGS. 2, 9 and 14. This is in accordance with theoretical calculations carried out in the 4H polytype by Torpo et al. (J. of Physics: Condens. Matter 13 p. 6203 (2001)) which predict that, the formation energy of intrinsic defects is of 3 to 4 eV for all defects, except for the silicon vacancy which requires a higher energy, estimated to about 8 eV. Accordingly, crystals containing silicon vacancies shall also contain the other intrinsic defects, as for example carbon vacancies and silicon antisites, at least in their neutral charge states. However, FIG. 9 indicates that these two intrinsic defects are not present in their positive charge state in crystals grown with too low concentration of titanium. The theoretical investigation cited above also suggests that the growth process stoichiometry (which is related to the so-called carbon to silicon ratio) only weakly affects the formation energies of the various intrinsic defects. This is in accordance with the experimental results of this invention.

It is known that titanium substitutes to the silicon site in the crystal lattice. This may explain that under growth conditions where titanium is present, the formation of silicon vacancies is less favoured.

Earlier DLTS measurements also determined that titanium produces at least two levels acting as electron traps (deep acceptors) located approximately 0.13 to 0.17 eV below the conduction band of the 4H polytype (see Dalibor T. et al, phys. Stat. Sol. (a) 162, p. 199 (1997)). Titanium thus acts as a very efficient trap for the electrons created by shallow donors such as nitrogen.

The presence of the positive charge state of the $V_C^+/V_C^0$ deep donor in crystals where it controls the Fermi level position and acts as electron and hole trap suggests that a deep acceptor level able to create holes is also associated to the presence of titanium in such crystals. This deep acceptor impurity related level is able to create a small amount of holes (FIG. 16, arrow (3)) that are overcompensated by the carbon vacancies (FIG. 16 arrow (4)).

Figure 16:
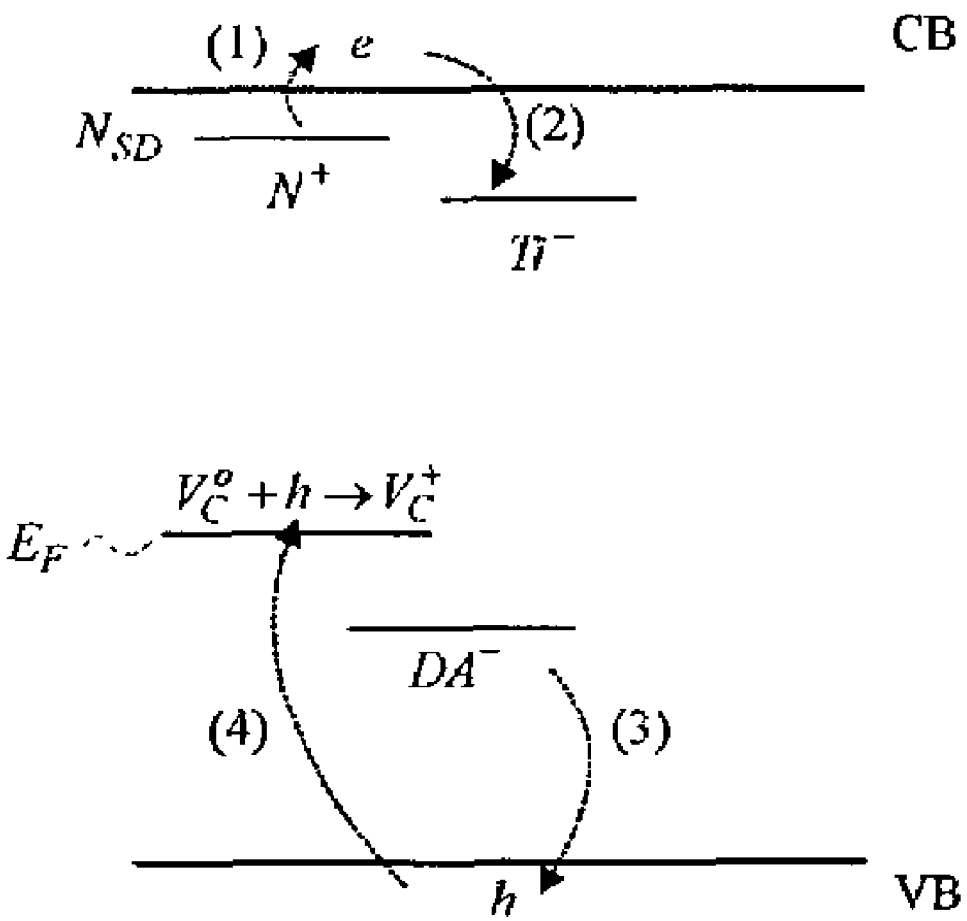
FIG. 16: model of the compensation mechanism of the preferred embodiment of the invention.

The efficient nature of titanium to produce high resistivity 4H silicon carbide crystals can further be justified by the high efficiency of the titanium levels below the conduction band to capture electrons created by any nitrogen donors (FIG. 16 arrows (1) and (2)), even if the nitrogen concentration is very low. Owing to the efficiency of this electron capturing process, only small concentrations of titanium are needed to make the crystal semi-insulating. Moreover, in the case of a non uniform distribution of the nitrogen concentration in the volume of the crystal, in some regions, the titanium concentration can locally exceed the nitrogen concentration. In such regions, unlike a shallow acceptor as aluminum, a deep acceptor as titanium can create only a small amount of holes. In presence of a such a deep acceptor, the Fermi level remain pinned at the intrinsic deep donor levels and the resistivity does not locally decrease in regions with lower residual nitrogen concentration. This enables the growth of crystals from which substrates with a radial uniform high resistivity can be prepared.

What is claimed is:

1. A semi-insulating silicon carbide single crystal having a resistivity of at least $10^5$ Ω·cm at 25° C., comprising:
   at least one deep impurity; and
   at least one deep intrinsic defect,
   wherein a concentration of the at least one deep impurity is sufficient to affect the resistivity of the crystal by compensating either shallow donors or shallow acceptors, but said concentration being lower than the concentration of deep intrinsic defects.

2. The silicon carbide crystal according to claim 1, wherein said at least one deep intrinsic defect has deep donor levels, and said at least one deep impurity has deep acceptor levels.

3. The silicon carbide crystal according to claim 2, wherein said at least one deep impurity has at least one level located in the upper half of the band gap.

4. The silicon carbide crystal according to claim 1, comprising at least two deep impurities, wherein two deep impurities are Titanium and Boron.

5. The silicon carbide crystal according to claim 1, wherein said at least one deep impurity is Titanium.

6. The silicon carbide crystal according to claim 1, wherein said at least one deep impurity is Boron.

7. The silicon carbide crystal according to claim 1, wherein said at least one deep intrinsic defect is a carbon vacancy or a single or a complex intrinsic defect related to the carbon site.

8. The silicon carbide crystal according to claim 1, wherein said at least one deep impurity is chosen from the IIIB, IVB, VB, VIB, VIIB or IIIA periodic columns.

9. The silicon carbide crystal according to claim 8, wherein said at least one deep impurity is either Sc, Ti, Nb, Cr, Mo, W, Mn, Fe, Co, Ni, B, or Ga.

10. The silicon carbide crystal according to claim 1, wherein said at least one deep intrinsic defect has a deep acceptor level, and said at least one deep impurity has a deep donor level.

11. The silicon carbide crystal according to claim 10, wherein said at least one deep intrinsic defect is a silicon vacancy.

12. The silicon carbide crystal according to claim 10, wherein said at least one deep impurity has at least one level located in the lower half of the band gap of the semiconductor.

13. The silicon carbide crystal according to claim 1, wherein said at least one deep impurity is chosen from the transition metals from the IIB, IVB, VB, VIB, VIIB or from the VA periodic columns.

14. The silicon carbide crystal according to claim 13, wherein said at least one deep impurity is either Ta, Zn or Mo.

15. The silicon carbide crystal according to claim 1, wherein the concentration of said at least one deep impurity is less than $10^{16}$ cm$^{-3}$.

16. The silicon carbide crystal according to claim 1, wherein the concentration of said at least one deep impurity is less than $5 \times 10^{15}$ cm$^{-3}$.

17. The silicon carbide crystal according to claim 1, wherein the concentration of said at least one deep impurity is sufficient to provide a uniform distribution of said resistivity in the crystal.

18. The silicon carbide crystal according to claim 1, wherein the polytype of the crystal is selected from the group consisting of: 4H, 6H, 15R and 3C.

19. The silicon carbide crystal according to claim 1, wherein said at least one deep impurity is introduced into the crystal during a crystal growth process.

20. The silicon carbide crystal according to claim 1, wherein said resistivity of the crystal measured at 25° C. does not substantially decrease after annealing the crystal at temperatures up to 1700° C.

21. The silicon carbide crystal according to claim 1, wherein an activation energy of said resistivity of the crystal remains substantially unchanged after annealing the crystal at temperatures up to 1700° C.

* * * * *